United States Patent
Abdelgadir et al.

(10) Patent No.: US 6,274,933 B1
(45) Date of Patent: Aug. 14, 2001

(54) INTEGRATED CIRCUIT DEVICE HAVING A PLANAR INTERLEVEL DIELECTRIC LAYER

(75) Inventors: Mahjoub Ali Abdelgadir; Alvaro Maury, both of Orlando, FL (US)

(73) Assignee: Agere Systems Guardian Corp., Murray Hill, NJ (US)

(*) Notice: Subject to any disclaimer, the term of this patent is extended or adjusted under 35 U.S.C. 154(b) by 0 days.

(21) Appl. No.: 09/376,233

(22) Filed: Aug. 17, 1999

Related U.S. Application Data
(60) Provisional application No. 60/117,186, filed on Jan. 26, 1999.

(51) Int. Cl.[7] ............ H01L 25/48; H01L 23/52; H01L 29/40
(52) U.S. Cl. ............ 257/758; 257/750; 257/752; 257/759
(58) Field of Search ............ 257/758, 750, 257/752, 759; 438/118, 622, 652, 626, 631, 645, 623

(56) References Cited

U.S. PATENT DOCUMENTS

| | | | |
|---|---|---|---|
| 5,578,531 | * 11/1996 | Kodera et al. | 438/622 |
| 5,759,906 | 6/1998 | Lou | 438/623 |
| 5,807,785 | 9/1998 | Ravi | 438/624 |
| 5,876,798 | 3/1999 | Vassiliev | 427/255.3 |
| 5,877,080 | 3/1999 | Aoi et al. | 438/622 |
| 6,008,120 | 12/1999 | Lee | 438/634 |
| 6,071,830 | * 6/2000 | Matsuzawa et al. | 438/778 |

FOREIGN PATENT DOCUMENTS

| | | | |
|---|---|---|---|
| 09 219448 | 8/1997 | (EP) | H01L/21/768 |
| 2 313 954 | 12/1997 | (GB) | H01L/21/316 |
| 8-111395 | * 4/1996 | (JP) . | |

OTHER PUBLICATIONS

Patent Abstracts of Japan, vol. 1996, No. 08, Aug. 30, 1996 & JP 08 111395 A (Sony Corp), Apr. 30 1996 *abstract; figures 1,2*.

* cited by examiner

*Primary Examiner*—Jhihan B Clark
(74) *Attorney, Agent, or Firm*—Allen, Dyer, Doppelt, Milbrath & Gilchrist, P.A.

(57) ABSTRACT

An integrated circuit includes a conductive layer adjacent a semiconductor substrate. The conductive layer includes conductive lines having gaps therebetween. A fluoro-silicate glass (FSG) layer is over the patterned conductive layer fills the gaps between conductive lines. Also, an undoped oxide layer is on the FSG layer. Peaks of the FSG layer which overlie the conductive metal lines have been reduced by CMP. Thus, a subsequent conductive layer is substantially protected from exposure to fluorine from the FSG layer.

14 Claims, 3 Drawing Sheets

US 6,274,933 B1

INTEGRATED CIRCUIT DEVICE HAVING A PLANAR INTERLEVEL DIELECTRIC LAYER

RELATED APPLICATIONS

This application is based upon prior filed copending provisional application Ser. No. 60/117,186 filed Jan. 26, 1999.

FIELD OF THE INVENTION

The present invention relates to the field of integrated circuits, and, more particularly, to integrated circuits having interlevel dielectric layers.

BACKGROUND OF THE INVENTION

To accommodate higher packing density in present integrated circuits, metal connection to integrated circuit devices formed in a semiconductor substrate are made by multilayer interconnects. Each level of multilayer interconnects is supported over the semiconductor substrate by an interlevel dielectric. Generally, the integrated circuit structure includes a dielectric layer and metal lines are laid down in parallel strips on top of the dielectric layer. Additional levels of multilayer interconnects are formed over this dielectric layer each including additional metal interconnects and an interlevel dielectric layer.

A number of methods for depositing dielectric materials by chemical vapor deposition (CVD) are currently available. For gap fill applications, CVD methods have their advantages. They are well-known processes, and they generally require a smaller number of overall steps than spin-on methods. For damascene processes, blanket deposition is all that is required for interlevel layers, and that can be done with either a CVD or a spin-on process. Pre-metal dielectric (PMD) and shallow-trench isolation (STI) require effective gap fill capability whether damascene is used or not. For STI, high-aspect ratio (e.g. 4:1) trenches must be filled with high-quality dielectric material.

One process for dielectric gap fill applications is high-density plasma CVD (HDP-CVD). HDP-CVD films are dry, compressive films that lend themselves well to multiple metal layer applications such as microprocessors. Since it is a plasma-based system, a typical HDP system would cost more than a tetra-exthyl oxysilane-ozone (TEOS/$O_3$) system, but it provides the throughput advantages of requiring fewer process steps. TEOS-ozone is used in many DRAM applications, since the market is more cost sensitive, and TEOS-ozone equipment costs less. TEOS-ozone films, as others that depend on a flow mechanism, must be annealed, which adds steps and increases production time.

The HDP-CVD oxide deposition process is actually a deposition-etchback process, where both are performed simultaneously. The plasma is a high-density mixture containing oxygen and argon. A DC bias pulls oxygen to the wafer surface where it reacts with silane ($SiH_4$) to form $SiO_2$. The argon simultaneously sputters deposited material away. The etchback is designed to remove overhang of the deposited material at the top of the gap. Although much of the deposited material is removed, it provides a time savings over some other methods since no anneal is required.

HDP-CVD was originally developed for interlevel dielectric (ILD) applications, but it also deposits high-quality material for STI, PMD and nitride etch-stop applications. Also, with the removal of the sputtering component of the plasma, it becomes a PECVD capping layer tool to prepare for chemical mechanical polishing (CMP). The etch:deposition (E:D) ratio, is usually kept somewhere between 0.14 and 0.33, and is controlled by the ratio of the gases, the chamber pressure, the ion-to-neutral flux ratio, the ion energy and the rf bias on the substrate.

HDP-CVD is used for depositing fluorosilicate glass (FSG), a low dielectric constant (low-k) dielectric. Low-k dielectrics reduce capacitive coupling between adjacent metal layers. Furthermore, an ideal low-k dielectric offers low-k as well as low leakage, low thermal coeffcient of expansion, high dielectric breakdown voltage, low water absorption, for example. FSG layers, which are a silicon oxyfluoride ($F_xSiO_y$), are known to have a dielectric constant of about 3.2–3.6, depending on the fluorine concentration. The high electronegativity of fluorine reduces the polarizability of the film, decreasing its dielectric constant. FSG layers are formed by adding silicon tetrafluoride ($SiF_4$) to the silane ($SiH_4$), $O_2$ and argon gases. HDP-CVD of FSG layers is relatively time consuming and expensive.

Chemical-mechanical polishing (CMP) is employed to planarize layers deposited on semiconductor wafers. Chemical mechanical polishing involves holding and rotating a semiconductor wafer against a wetted polishing platen under controlled chemical, pressure and temperature conditions. Typically a slurry solution is used as the abrasive fluid. The polishing mechanism is a combination of mechanical action and the chemical reaction of the material being polished with the slurry solution.

U.S. Pat. No. 5,807,785 to Ravi, for example, discloses a sandwich silicon dioxide layer for filling gaps in the metal layers on a semiconductor substrate. A first layer is formed by plasma-enhanced CVD (PECVD) and a second layer is formed by sub-atomic CVD (SACVD) to achieve a low dielectric constant. Also, U.S. Pat. No. 5,759,906 to Lou discloses a planarization method for dielectric layers using a multilayer of spin-on glass (SOG) which is deposited and baked after the deposition of each layer.

There is a need for a planarized low-k interlevel dielectric layer including an HDP-CVD FSG layer which is more cost effective and substantially decreases the risk of exposing the metal in the conductive layers to potential fluorine attack.

SUMMARY OF THE INVENTION

In view of the foregoing background, it is therefore an object of the invention to provide an integrated circuit device having a planarized low-k interlevel dielectric layer including an HDP-CVD FSG layer which protects the conductive layers from fluorine exposure.

This and other objects, features and advantages in accordance with the present invention are provided by an integrated circuit device comprising a first metal layer adjacent a semiconductor substrate, the first metal layer including a plurality of patterned metal lines having gaps therebetween, and at least some of the plurality of patterned metal lines having different widths. The device further includes a composite dielectric layer comprising a fluoro-silicate glass (FSG) layer over the plurality of patterned metal lines and filling the gaps between the plurality of patterned metal lines, and a planar undoped oxide layer on the FSG layer. A second metal layer may be adjacent the planar undoped oxide layer. The FSG layer has a plurality of peaks each of which is above one of the plurality of patterned metal lines and each of which has substantially a same height above the first metal layer to protect the second metal layer from exposure to fluorine from the FSG layer.

The device may also include a protective dielectric layer on the patterned metal lines, and the undoped oxide layer may comprise an undoped-silicate glass (USG). The first metal layer may comprise at least one of aluminum and copper and the FSG layer preferably has a thickness of at least 100 nanometers higher than the thickness of the first metal layer.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for clarity.

Figure 1:
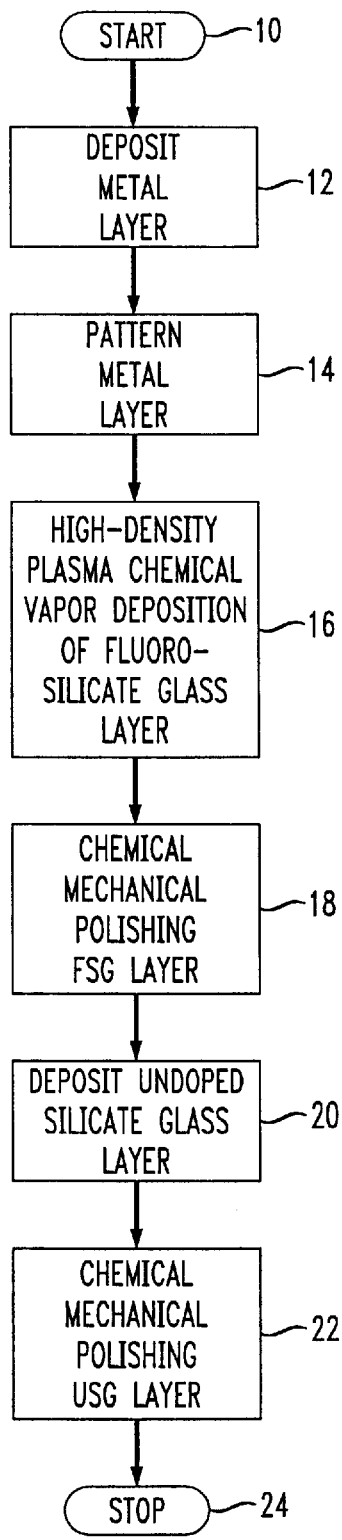
FIG. 1 is a flowchart generally illustrating the method steps for making an integrated circuit device with an interlevel dielectric layer in accordance with the present invention.

Referring to FIG. 1, the basic steps of the method of making an integrated circuit including an interlevel dielectric layer in accordance with the present invention are now described. In accordance with the present invention, the method begins (Block 10) and a conductive metal layer is deposited at Block 12. Such a metal layer may be formed or deposited by electrodeposition, electroplating or CVD techniques known to the skilled artisan. The metal layer is patterned (Block 14) to form metal lines having gaps therebetween. Such metal lines may have different widths and may be patterned by well known photolithography techniques as would readily be appreciated by those skilled in the art.

Next, at Block 16, an FSG layer is formed by high-density plasma chemical vapor deposition (HDP-CVD). The FSG layer fills in the gaps between the metal lines and covers the metal layer thereby forming peaks corresponding to or overlying the metal lines. At Block 18, the peaks of the FSG layer are chemically mechanically polished to reduce the height thereof. This is a relatively short CMP step to reduce the FSG peaks above the metal lines without exposing the metal lines.

CMP is employed to convert a conformal deposited FSG layer into a substantially more planar oxide surface. Without CMP, the conformal FSG layer conforms to the shape of the layer of patterned metal lines. Fluctuations in the surface of the conformal oxide layer exist above metal lines in the metal layer. With CMP, FSG peaks on the surface of a wafer are reduced, producing a more planar layer of oxide above the metal lines. An undoped oxide layer, such as undoped silicate glass (USG), is formed on the FSG layer at Block 20 and then chemically mechanically polished (Block 22) to planarize the interlevel dielectric layer, if necessary, before ending the process (Block 24).

Figure 2:
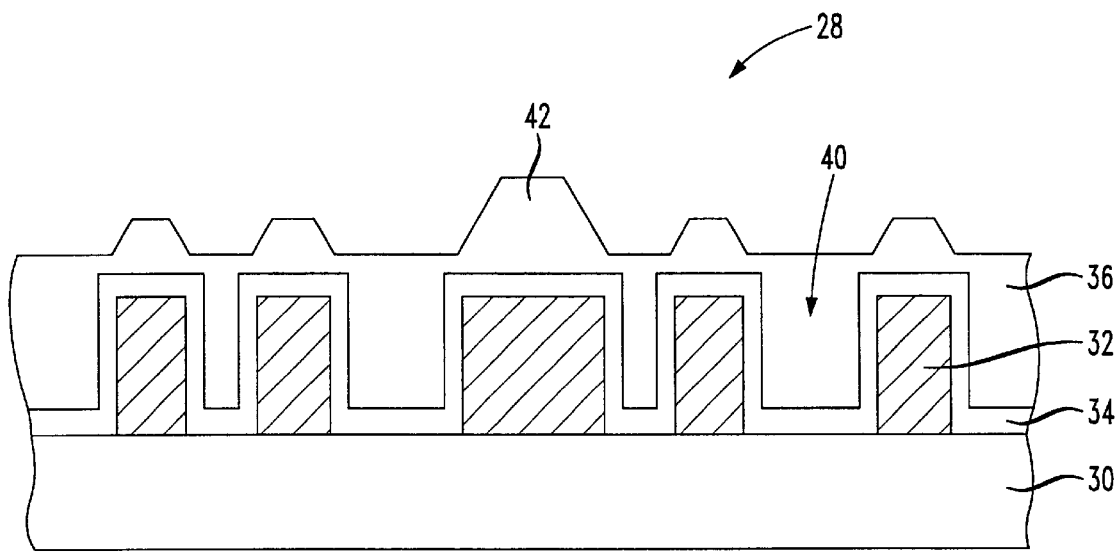
FIGS. 2–4 are cross-sectional views of an integrated circuit device illustrating the formation thereof in accordance with the present invention.
Figure 3:
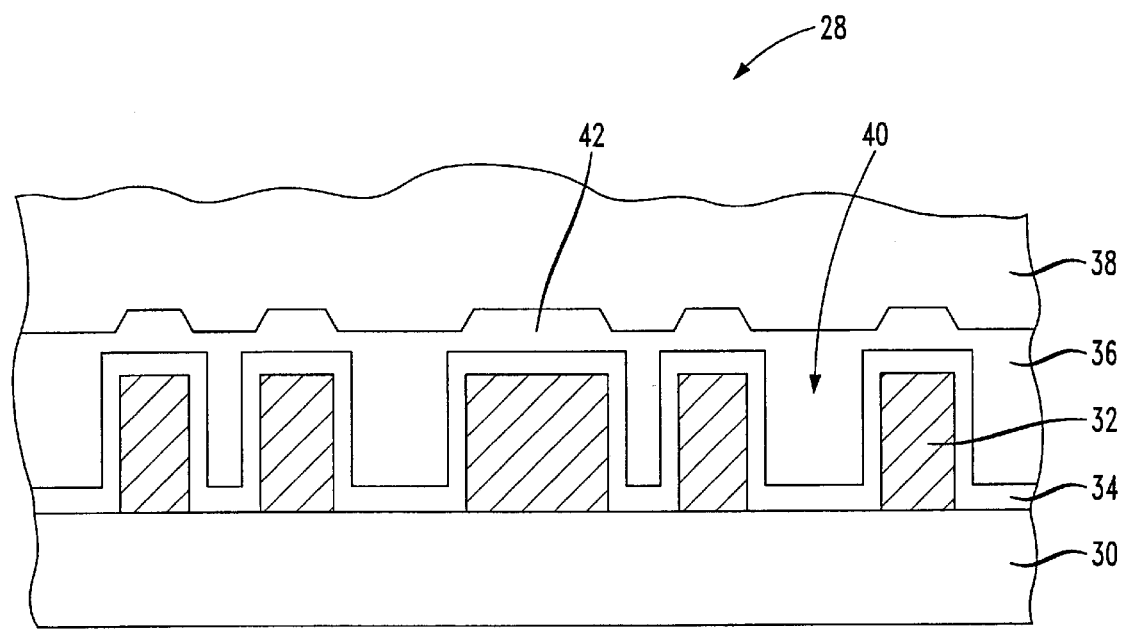
Figure 4:
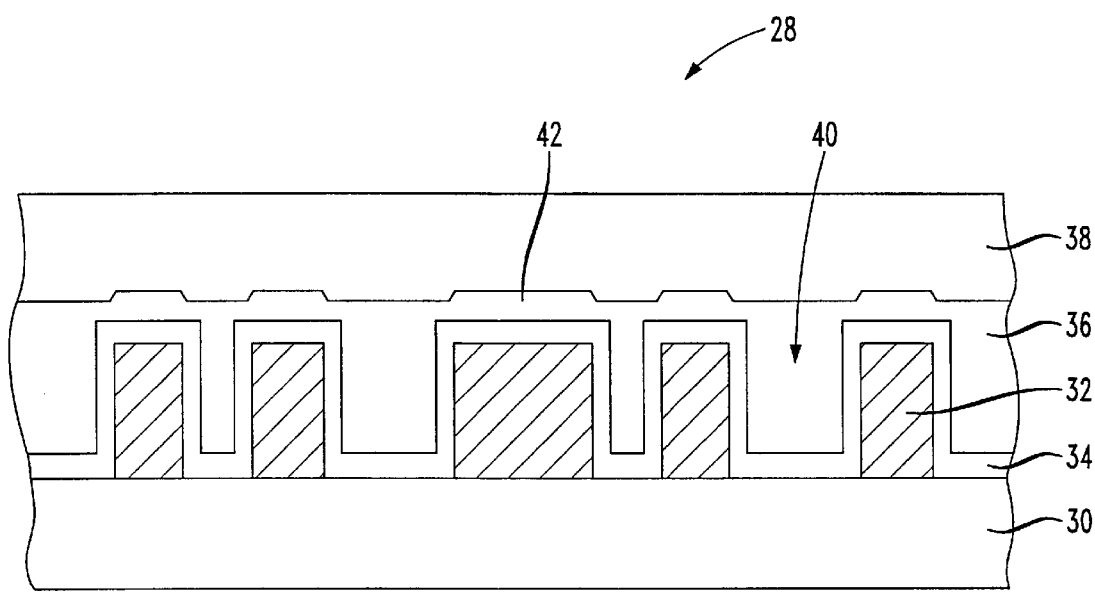

Referring to the cross-sectional views FIGS. 2–4, an integrated circuit device 28 including an interlevel dielectric layer in accordance with the present invention is now described. The semiconductor substrate 30 is preferably silicon, or may be silicon or a polysilicon layer or structure formed on the substrate. A plurality of devices, such as transistors (not shown), are formed in the substrate 30 using well known techniques. The semiconductor device 28 may include a first dielectric layer (not shown) adjacent the substrate 30. Such a first dielectric layer is formed from any suitable dielectric, e.g., silicon dioxide, silicon nitride and/or any material or alloy of material having a desired dielectric constant. Other suitable materials include tantalum pentoxide and barium strontium titantate, for example.

The integrated circuit 28 includes a plurality of conductive lines 32 on the substrate 30. The conductive lines 32 are formed by a conventional subtractive etch technique in which a conductive layer, such as aluminum and/or copper, is electrodeposited on the substrate 30, and a photoresist layer (not shown) is formed and patterned over the conductive layer using well known photolithography techniques to define the locations where the conductive lines 32 are to be formed. Next, the conductive layer is etched in the desired pattern to form the conductive lines 32 having gaps 40 therebetween.

The integrated circuit 28 may include a protective dielectric layer 34 over the conductive lines 32. Such a protective dielectric layer 34 may be formed of USG and may be grown, deposited or formed by any other suitable technique. The protective dielectric layer 34 serves to protect the conductive lines 32 from exposure to potentially harmful fluorine in the subsequently deposited FSG layer 36.

The low-k FSG layer 36 is formed by HDP-CVD to a desired height and has a dielectric constant of about 3.2–3.6, depending on the fluorine concentration. For example, the height of the deposited FSG layer 36 may be at least 250 nanometers above the conductive lines 32. The HDP-CVD oxide deposition step is a deposition-etchback process, where both are performed simultaneously. The plasma is a high-density mixture containing oxygen and argon. A DC bias pulls oxygen to the wafer surface where it reacts with silane ($SiH_4$) and/or silicon tetrafluoride ($SiF_4$) to form $SiO_2$. The argon simultaneously sputters deposited material away. HDP-CVD layers are dry, compressive layers that lend themselves well to multiple metal layer applications such as microprocessors.

As illustrated in FIG. 2, HDP-CVD FSG is a conformal oxide layer having peaks 42 formed above the conductive lines 32. The height of a peak 42 corresponds to the respective widths and/or spacing of the conductive lines 32. The widest conductive lines 32 (e.g. above a predetermined dimension) may have the full height of the deposited FSG layer thereon.

To reduce the height of these peaks 42, the FSG layer is chemically mechanically polished. The integrated circuit device 28 is held and rotated against a wetted polishing platen under controlled chemical, pressure and temperature conditions. Typically a slurry solution is used as the abrasive fluid. The polishing mechanism is a combination of mechanical action and the chemical reaction of the material being polished with the slurry solution. This is a relatively short CMP step to reduce the FSG peaks 42 above the conductive lines 32 without exposing the metal lines. A typical polishing rate for CMP in other etchback steps is about 250 nanometers/minute, but in the present invention, the FSG layer 36 is polished for about 15–30 seconds (or an equivalent time to remove about 150 nm of a blanket oxide). This is done to leave about 100 nm of FSG 36 on the conductive lines 32. The CMP step substantially eliminates the variation in height of the peaks 42 as each of the resulting polished peaks 42 has substantially the same height. Because the height of the peaks 42 of the FSG layer 36 have been reduced, the potential of subsequent conductive lines being exposed to fluorine has been substantially decreased.

As also illustrated in FIG. 2, the integrated circuit 28 includes an undoped oxide layer 38. This undoped oxide layer 38 may be undoped silicate glass (USG), for example, and may be formed by any suitable technique know to those skilled in the art. The undoped oxide layer 38 is then planarized by CMP if necessary as illustrated in FIG. 3. The FSG layer 36 and the undoped oxide layer 38 form a composite dielectric layer. Such a composite dielectric layer allows the integration of a low-k dielectric material, such as FSG, as the gap fill dielectric without having to use a relatively thick FSG layer which is relatively expensive. Furthermore, a planar interlevel dielectric layer including a low-k dielectric, which protects the conductive layers from fluorine exposure, is achieved.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An integrated circuit device comprising:

a semiconductor substrate;

a conductive layer adjacent the semiconductor substrate, the conductive layer including patterned conductive lines having gaps therebetween, and at least some of the patterned conductive lines having different widths; and a composite dielectric layer comprising
      a fluoro-silicate glass (FSG) layer over the patterned conductive lines and filling the gaps between the patterned conductive lines, the FSG layer having peaks which overlie the conductive lines and which have a substantially uniform height above the conductive layer, and
      a planar undoped oxide layer on the FSG layer.

2. The device according to claim 1, further comprising a protective dielectric layer on the patterned conductive lines.

3. The device according to claim 1, wherein the undoped oxide layer comprises an undoped-silicate glass layer (USG).

4. The device according to claim 1, wherein the conductive layer is a metal layer and comprises at least one of aluminum and copper.

5. The device according to claim 1, wherein the FSG layer has a thickness of at least 100 nanometers higher than the thickness of the conductive layer.

6. An integrated circuit device comprising:

a semiconductor substrate;

a first metal layer adjacent the semiconductor substrate, the first metal layer including a plurality of patterned metal lines having gaps therebetween, and at least some of the plurality of patterned metal lines having different widths;

a composite dielectric layer comprising
      a fluoro-silicate glass (FSG) layer over the plurality of patterned metal lines and filling the gaps between the plurality of patterned metal lines, and
      a planar undoped oxide layer on the FSG layer; and a second metal layer adjacent the planar undoped oxide layer;

the FSG layer having a plurality of peaks each of which is above one of the plurality of patterned metal lines and each of which has substantially a same height above the first metal layer to protect the second metal layer from exposure to fluorine from the FSG layer.

7. The device according to claim 6, further comprising a protective dielectric layer on the patterned metal lines.

8. The device according to claim 6, wherein the undoped oxide layer comprises an undoped-silicate glass layer (USG).

9. The dielectric according to claim 6, wherein the first metal layer comprises at least one of aluminum and copper.

10. The device according to claim 6, wherein the FSG layer has a thickness of at least 100 nanometers higher than the thickness of the first metal layer.

11. A composite planar interlevel dielectric for an integrated circuit including a plurality of patterned metal lines having gaps therebetween, and at least some of the plurality of patterned metal lines having different widths, the dielectric comprising:

a fluoro-silicate glass (FSG) layer over the plurality of patterned metal lines and filling the gaps between the plurality of patterned metal lines, the FSG layer having a plurality of peaks each of which is above one of the plurality of patterned metal lines and each of which has substantially a same height above the plurality of patterned metal lines to protect a subsequent metal layer from exposure to fluorine from the FGS layer; and a planar undoped oxide layer on the FSG layer.

12. The dielectric according to claim 11, further comprising a protective oxide layer on the plurality of patterned metal lines.

13. The dielectric according to claim 11, wherein the undoped oxide layer comprises an undoped-silicate glass layer (USG).

14. The dielectric according to claim 11, wherein the FSG layer has a thickness of at least 100 nanometers higher than the thickness of the plurality of patterned metal lines.

* * * * *

UNITED STATES PATENT AND TRADEMARK OFFICE
CERTIFICATE OF CORRECTION

PATENT NO. : 6,274,933 B1
DATED : August 14, 2001
INVENTOR(S) : Abdelgadir et al.

It is certified that error appears in the above-identified patent and that said Letters Patent is hereby corrected as shown below:

Title page illustrating figure(s) should be deleted, and substituted therefore, the attached title page illustrating figure(s).

<u>Title page,</u>
Item [57], ABSTRACT,
Line 4, delete "conductive layer fills" insert -- conductive layer and fills --

<u>Column 5,</u>
Line 4, after "lines" insert -- (e.g. of metal layer 44 adjacent the undoped oxide layer 38, as shown in FIG. 4) --
Line 10, delete "technique know to those" insert -- technique known to those --

Signed and Sealed this

Twenty-sixth Day of July, 2005

JON W. DUDAS
*Director of the United States Patent and Trademark Office*

(12) United States Patent
Abdelgadir et al.

(10) Patent No.: US 6,274,933 B1
(45) Date of Patent: Aug. 14, 2001

(54) INTEGRATED CIRCUIT DEVICE HAVING A PLANAR INTERLEVEL DIELECTRIC LAYER

(75) Inventors: Mahjoub Ali Abdelgadir; Alvaro Maury, both of Orlando, FL (US)

(73) Assignee: Agere Systems Guardian Corp., Murray Hill, NJ (US)

(*) Notice: Subject to any disclaimer, the term of this patent is extended or adjusted under 35 U.S.C. 154(b) by 0 days.

(21) Appl. No.: 09/376,233

(22) Filed: Aug. 17, 1999

Related U.S. Application Data

(60) Provisional application No. 60/117,186, filed on Jan. 26, 1999.

(51) Int. Cl.$^7$ .................. H01L 25/48; H01L 23/52; H01L 29/40
(52) U.S. Cl. .................. 257/758; 257/750; 257/752; 257/759
(58) Field of Search .................. 257/758, 750, 257/752, 759; 438/118, 622, 652, 626, 631, 645, 623

(56) References Cited

U.S. PATENT DOCUMENTS

| | | | |
|---|---|---|---|
| 5,578,531 | * 11/1996 | Kodera et al. | 438/622 |
| 5,759,906 | 6/1998 | Lou | 438/623 |
| 5,807,785 | 9/1998 | Ravi | 438/624 |
| 5,876,798 | 3/1999 | Vassiliev | 427/255.3 |
| 5,877,080 | 3/1999 | Aoi et al. | 438/622 |
| 6,008,120 | 12/1999 | Lee | 438/634 |
| 6,071,830 | * 6/2000 | Matsuzawa et al. | 438/778 |

FOREIGN PATENT DOCUMENTS

| | | | |
|---|---|---|---|
| 09 219448 | 8/1997 | (EP) | H01L/21/768 |
| 2 313 954 | 12/1997 | (GB) | H01L/21/316 |
| 8-111395 | * 4/1996 | (JP) . | |

OTHER PUBLICATIONS

Patent Abstracts of Japan, vol. 1996, No. 08, Aug. 30, 1996 & JP 08 111395 A (Sony Corp), Apr. 30 1996 *abstract; figures 1,2*.

* cited by examiner

*Primary Examiner*—Jhihan B Clark
(74) *Attorney, Agent, or Firm*—Allen, Dyer, Doppelt, Milbrath & Gilchrist, P.A.

(57) ABSTRACT

An integrated circuit includes a conductive layer adjacent a semiconductor substrate. The conductive layer includes conductive lines having gaps therebetween. A fluoro-silicate glass (FSG) layer is over the patterned conductive layer fills the gaps between conductive lines. Also, an undoped oxide layer is on the FSG layer. Peaks of the FSG layer which overlie the conductive metal lines have been reduced by CMP. Thus, a subsequent conductive layer is substantially protected from exposure to fluorine from the FSG layer.

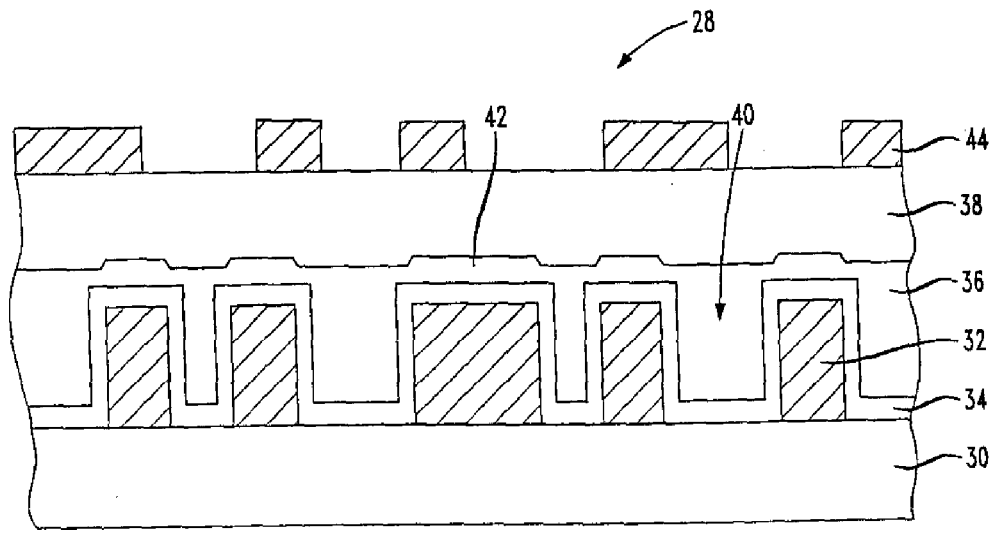

14 Claims, 3 Drawing Sheets